United States Patent [19]
Kaneff

[11] Patent Number: 5,934,271
[45] Date of Patent: Aug. 10, 1999

[54] LARGE APERTURE SOLAR COLLECTORS WITH IMPROVED STABILITY

[75] Inventor: Stephen Kaneff, Red Hill, Australia

[73] Assignee: Anutech PTY Limited, Australia

[21] Appl. No.: 09/052,378

[22] Filed: Mar. 31, 1998

Related U.S. Application Data

[63] Continuation-in-part of application No. 08/765,910, Jan. 16, 1997, abandoned.

[30] Foreign Application Priority Data

Jul. 19, 1994 [AU] Australia ............................... PM 6936
Jul. 19, 1995 [WO] WIPO ..................... PCT/AU95/00439

[51] Int. Cl.⁶ .......................................................... F24J 2/38
[52] U.S. Cl. ............................... 126/600; 126/605; 353/3
[58] Field of Search ..................................... 126/600–608, 126/685–687, 696; 353/3

[56] References Cited

U.S. PATENT DOCUMENTS

| | | | |
|---|---|---|---|
| 4,572,160 | 2/1986 | Blikken et al. | 126/439 |
| 4,784,700 | 11/1988 | Stern et al. | 136/248 |
| 4,841,946 | 6/1989 | Marks | 126/451 |
| 5,275,149 | 1/1994 | Lublow | 126/605 |
| 5,529,054 | 6/1996 | Shoen | 126/681 |
| 5,540,216 | 7/1996 | Rasmusson | 126/683 |

FOREIGN PATENT DOCUMENTS

| | | |
|---|---|---|
| 248208 | 5/1963 | Australia . |
| 20942/76 | 6/1978 | Australia . |
| 25685/77 | 12/1978 | Australia . |
| 30779/77 | 5/1979 | Australia . |
| 108506 | 2/1994 | Israel . |
| 94/11918 | 5/1994 | WIPO . |

*Primary Examiner*—Carroll B. Dority
*Attorney, Agent, or Firm*—Cesari and McKenna, LLP

[57] ABSTRACT

A solar collection antenna has a large aperture reflective dish which is mounted on a dish support fame. When the dish is pointed at the sun, it reflects received solar radiation into a zone of concentration, at which either a solar energy receiver or a secondary reflector (supported by an ancillary support) is located. To track the sun, the dish is rotated about a first axis which is transverse the dish aperture and a second, orthogonal axis (which intersects the first axis). The center of mass of the combination of the dish, its support frame, the solar energy receiver or secondary reflector and the ancillary support is relatively close to the lower edge of the dish, and lies substantially on the transverse axis of rotation, at the point where the first and second axes intersect (or almost intersect). The dish aperture is chosen so that the dish experiences balanced wind loading about its transverse axis of rotation.

17 Claims, 6 Drawing Sheets

LARGE APERTURE SOLAR COLLECTORS WITH IMPROVED STABILITY

CROSS-REFERENCE

This application is a continuation-in-part of U.S. patent application Ser. No. 08/765,910, filed Jan. 16, 1997 and now abandoned.

TECHNICAL FIELD

This invention concerns solar collectors. More particularly it concerns solar collectors which use a reflective dish or antenna, having a large aperture, to concentrate ration from the sun into at least one zone. In some instances, a solar energy receiver (which in the context of this specification means a region into which solar energy is concentrated; normally an absorber of solar energy or another mechanism which receives and utilises the concentrated solar energy is positioned within this region, but the presence of an absorber or such a mechanism is not is essential) is located at the zone into which the reflected solar energy is concentrated. In other instances, the solar collector includes a Cassegrain optical arrangement and a secondary reflector, which reflects the concentrated solar energy from the large dish into a remote solar energy receiver, is located at the (or each) zone into which the reflected solar energy is concentrated.

BACKGROUND TO THE INVENTION

Large aperture solar concentrating reflectors, usually having a cross-section which is substantially parabolic or spherical (generally called "dishes" because of the dish-like shape of the reflectors) have been under development for more than 20 years. Such collectors with large dishes have potentially the highest efficiency of conversion of incident solar energy into heat. They can be used to provide the highest useful temperatures.

For example, a solar collector installation using trough-like collectors of parabolic cross-section to supply heat to create steam to drive turbogenerators is reported to be currently supplying 354 megawatts of electrical power to the electricity grid in California, USA.

A recent design of a solar collector with a large aperture dish is described in the specification of International patent application No. PCT/AU93/00588, which was published as WIPO Publication No. WO 94/11918. That solar collector, which is illustrated in FIGS. 1 and 2 of the drawings of WIPO Publication No. WO 94/11918, is also featured in the specifications of Australian patent No. 677,257, Israel patent No. 107,647 and U.S. patent application Ser. No. 08/436, 222. Using that solar collector it has been possible to generate temperatures in excess of 2,000° C.

In general terms, large aperture dishes which concentrate solar energy have many uses requiring temperatures in the range of from 200° C. to over 1,500° C. Among these uses are the cost-effective generation of electricity by the solar thermal path and the powering of many thermochemical and photochemical processes (including the thermochemical conversion of solar energy, solar gasification of hydrocarbon fossil fuel and biomass materials, the production of reduced-pollution or very low pollution liquid and gaseous fuels, and the production of a range of chemicals and other energy-rich products).

When in use, the dish of this type of solar collector must be "tracked" so that it faces the sun throughout the day, in order to focus continuously the incident solar energy on to a receiver (a zone where there is usually a solar energy absorber) which is at the focus of the dish. The tracking requirements are such that any material (solid, liquid or gas) which is to be introduced to the receiver at the energy concentration zone or focal region must be conveyed along a moving path, for the receiver is fixed relative to the dish and thus moves as the dish tracks the sun. It is necessary, therefore, for flexible or rotary joints to be included in the supply line to the receiver. When high temperature and/or high pressure fluids are conveyed in the supply line, such joints are difficult to produce and when certain temperatures and pressures are exceeded, if such joints are available they are costly and detract from the economics of the processes to be powered by the collected solar energy.

Another problem experienced with current solar collector dishes (including the dish depicted in the aforementioned WIPO Publication No. WO 94/11918) is the adequate insulation of the fluid transmission line which conveys ground-based materials to and from the solar receiver. Such a lie or pathway can be of considerable length and the cost penalty associated with its insulation (and with the rotary and flexible joints in this line if it has to weave through a structure of some complexity in order to reach the receiver) is a significant proportion of the cost of the entire solar energy collector system. In addition, significant pumping power may be required to convey the materials to the receiver, which is not readily accessible while moving, and instrumentation for the fluid transport system also poses problems.

A further factor which affects the cost-effectiveness of altitude-azimuth tracking of such solar collector dishes is the dish actuation mechanism (the driving mechanism) which ensures that the collector faces the sun. This requires robust components if it is to be capable of controlling the position of the dish in strong winds.

A collector using a dish which has a conventional aperture shape (circular or hexagonal) and employing altitude-azimuth tracking throughout the day is normally mounted on a tower (so that it can receive solar radiation when the sun is on or slightly above the horizon). The dish may be balanced about its transverse (horizontal) axis of rotation by the addition of a counterweight which is supported on the dish support frame, to make the rotation of the dish about that axis easier to achieve and control. However, counterweights (i) are expensive, (ii) add to the total load being rotated, and (iii) complicate the structural requirements for the collector or antenna. Such a collector will be affected by winds at all times and this means that the strength requirements for the collector structure are increased in locations where high winds are likely to be experienced. In addition, the mechanisms for rotating the dish and their associated hardware require special features to enable some components to be reached (for checking, adjustment or replacement). Those features add to the cost and inconvenience of even routine maintenance.

As persons familiar with dish-tracking arrangements will be aware, if the dish is to be tracked by polar-equatorial movement of the dish, there is a dish transverse (generally east-west) axis about which the dish is rotated to vary its equatorial inclination, and a north-south (polar) axis about which the dish is rotated during the day to track the sun from sunrise to sunset. The structures normally used for polar-equatorial tracking are relatively high above the ground, to allow for rotation of the dish about the polar axis, and thus have to be constructed to withstand high wind loading, and the dish actuation mechanisms must also be robust.

Constructing the reflective surface of a large aperture dish is also a costly exercise. This surface is sometimes approximated by a series of plane mirrors of sufficient number and of such size that the necessary concentrating ratio is achieved. Such mirrors need to be mounted on the dish support frame in a manner which allows each segment of the mirror to concentrate radiation on to the receiver (that is, the dish support frame itself must be of the correct shape to achieve the necessary concentration of the solar energy). Except in the case of very low temperature receivers, the number of plane mirror segments must be large. Thus it is more usual to construct the dish using a lesser number of curved mirrors. When many plane mirror segments or curved mirrors are employed, a significant fraction of the collector cost is incurred in the construction of the reflective surface. Hence considerable developmental effort has gone into producing more cost-effective reflective surfaces during recent years.

DISCLOSURE OF THE PRESENT INVENTION

It is an objective of the present invention to provide a solar collector having a large aperture reflecting dish, which is rotatable about two axes to track the sun (using, for example, the altitude-azimuth tracking arrangement or the polar-equatorial tracking arrangement), and which is balanced in terms of both mass and wind loading, preferably without the use of a counterweight. When compared with a conventional large aperture solar collector of similar dish dimensions, such a solar collector will be less expensive to construct, will require less power to actuate its tracking mechanisms, and will be inherently more stable.

This objective is achieved by regarding the combination of (i) the dish, (ii) its support frame, and (iii) a solar energy receiver (or a secondary reflector if a Cassegrain arrangement is to be used) which is mounted on the dish or on its support frame, as a single entity and designing this combination so that the centre of mass of the combination is a short distance above the lower edge of the dish (when the dish is pointed at or slightly above the horizon), compared to the linear dimensions of the dish. In addition, one of the axes of rotation of the dish, which the present inventor has termed the transverse axis of rotation of the dish, is arranged to pass through, or very close to, the centre of mass of this combination. The transverse as is a horizontal axis of rotation in the case of a dish which has an altitude-azimuth tracking arrangement. If the dish has a polar-equatorial tracking arrangement, the transverse axis is the generally east-west as (which is truly east-west and is horizontal at mid-day, when the sun is above the meridian through the dish) about which the dish is rotated by a small angle which differs for each day. The collector construction also ensures that the other axis of rotation of the dish (which is always orthogonal to the transverse as of rotation of the dish, being a vertical axis in the case of a dish with altitude-azimuth tracking and being the polar axis if the dish is tracked by the polar-equatorial technique) intersects, or nearly intersects, the transverse axis of rotation, and the shape of the aperture of the dish is such that when the dish is tracking the sun, the wind loading on the dish below the transverse axis of rotation is equal to, or nearly equal to, the wind loading on the dish above the transverse axis of rotation.

Thus, in accordance with the present invention, there is provided a solar energy collection antenna comprising a reflecting dish having a large aperture, said dish being mounted on a dish support frame, said dish support frame being mounted for rotation about a first axis which is transverse the dish and a second axis which is orthogonal to said first axis; either a secondary reflector or a solar energy receiver mounted on an ancillary support means affixed to said dish or to said dish support frame, said secondary reflector or receiver being located at a zone into which, when said dish is in use and is receiving solar energy, the solar energy reflected from said dish is concentrated; the combination of said dish, said dish support frame, said ancillary support means and said secondary reflector or said receiver having a combination centre of mass; characterised in that:

(a) the distance of said combination centre of mass above the lower edge of said dish is small relative to the linear dimensions of said dish;

(b) said first axis substantially intersects said second axis;

(c) said combination centre of mass lies substantially on said first axis; and (d) the shape of said aperture is such that, when the solar collector is in use, the wind loading on said dish below said first axis is substantially equal to the wind loading on said dish above said first axis.

The reflective surface of the dish is constructed using a number of reflective elements which reflect incident solar energy. The incident solar energy is reflected to a zone which is chosen to be either "on-axis" (that is, to a zone which is on the pointing axis of the dish) or "off-axi" (that is, to a zone of concentration which is not on the pointing axis of the dish). With the latter arrangement, the zone of concentration of the collector to which the reflected radiation is directed should be below the direction in which the dish is pointing, to minimise (and possibly avoid completely) the blocking, by the solar energy receiver or the secondary reflector, of part of the solar radiation that is incident on the dish. This arrangement also assists in keeping the centre of mass of the above-mentioned combination low and (if a receiver which includes a solar energy absorber is mounted on the dish or the dish support frame) minimises the length of the fluid connections to the receiver.

If a secondary reflector is used in the collector of the present invention, the secondary reflector will normally be shaped so that it further concentrates the solar energy reflected from the main dish of the collector onto another (usually smaller) zone of concentrated solar energy, at which a solar energy receiver is located. Preferably that zone of concentrated solar energy (usually termed a "focal zone") will be at, or close to, the intersection or the near intersection of the two axes of rotation of the dish.

These and other features of the present invention will be farther explained in the following description of embodiments of the present invention, which are examples only of the invention. In the following description, reference will be made to the accompanying drawing.

DETAILED DESCRIPTION OF THE ILLUSTRATED EMBODIMENTS

Figure 1:
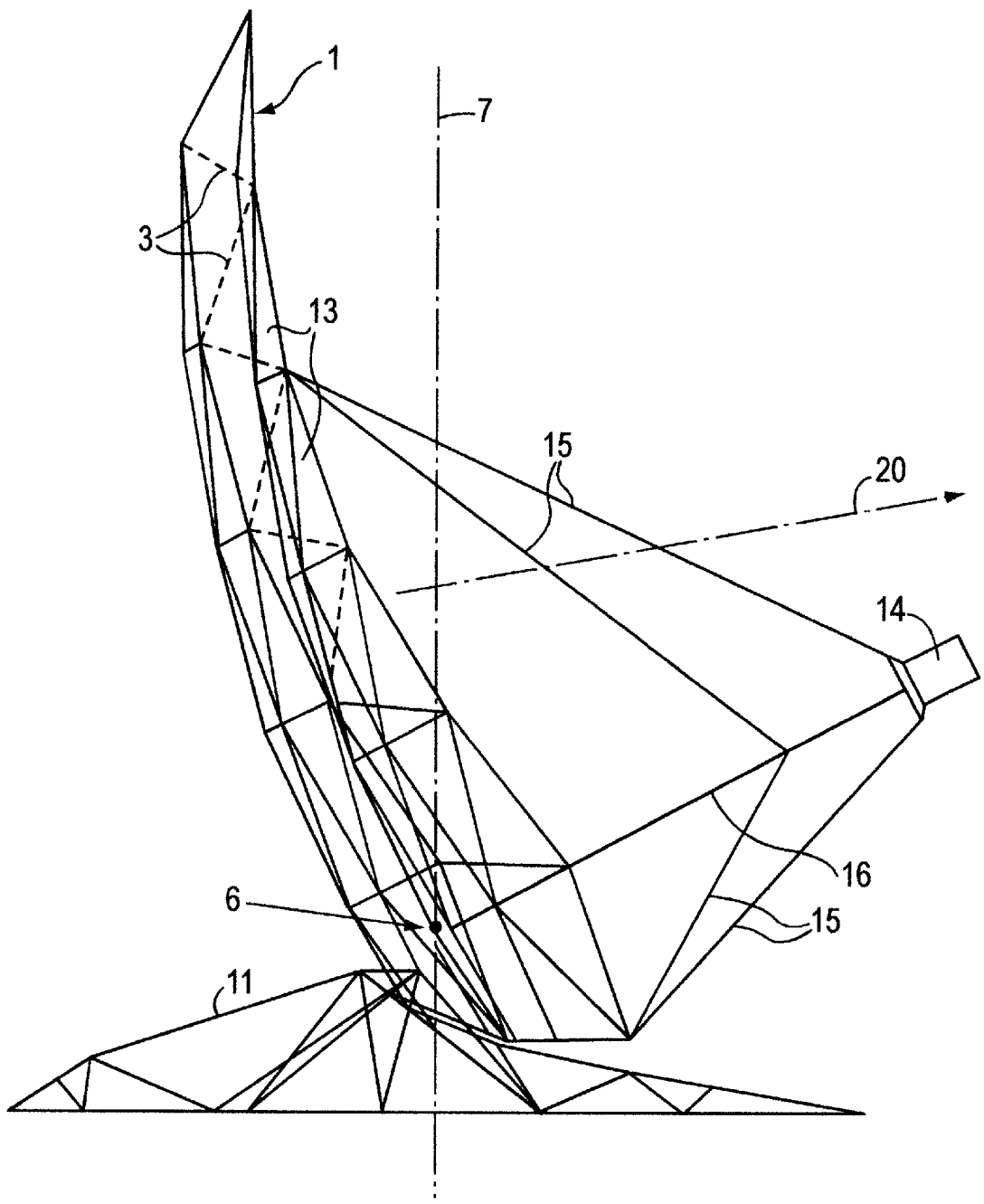
FIG. 1 is a partly schematic side elevation of a solar energy collector which has been constructed in accordance with the present invention, with the dish of the collector concentrating solar energy onto a solar energy receiver.

The solar collector shown in FIG. 1 has a reflective dish 1 mounted on a dish support frame 2. In the collector of FIG. 1, the dish 1 comprises a plurality of triangular mirror-like reflectors 13, each affixed to the support frame 2. However, the dish 1 may be constructed in any other suitable manner. The dish support frame 2 is preferably an arrangement of rigid struts 3, assembled as a plurality of tetrahedral strut assemblies, as described in the aforementioned WIPO Publication No. WO 94/11918.

The dish 1 and its associated support frame 2 is mounted on a base frame 11 which rotates about a vertical axis 7. The mounting arrangement of the support frame 2 ensues that the dish is rotatable about a transverse (horizontal) axis which passes through or close to the point 6. Thus the collector of FIG. 1 is designed to track the sun using the altitude-azimuth tracking arrangement. A number of actuation mechanisms for rotation of a large dish about a designated axis, and for rotating the base frame of an antenna structure about a vertical axis, have been developed during the last 40 years. Typically, the base frame movement is achieved by an action mechanism which drives the base fame (which is provided with wheels that run in a circular track on a concrete slab on the ground) so that it rotates around the vertical axis. However, any suitable action mechanisms may be used to cause the dish of the collector of FIG. 1 to track the sun. The preferred dish rotation mechanisms are those described in WIPO Publication No. WO 94/11918.

A solar energy receiver 14 is positioned at the zone into which the solar energy reflected by the dish 1 is concentrated. The receiver is mounted in this position by ancillary support means in the form of a support mast 16 and guy wires 15. The support mast 16 has its end which is remote from the receiver 14 connected to either the dish 1 or the dish support frame 2. The receiver 14 may be "on-axis", in which case the pointing axis of the dish will be aligned with the support mast 16. If the receiver 14 is mounted "off-axis", the dish 1 would typically have the pointing axis 20.

Construction engineers will appreciate that it is a relatively straightforward task to design a dish 1, its support frame 2, the receiver 14 and its ancillary support (mast 16 and guy lines 15) so that (a) the centre of mass of this combination is at, or is nearly at, the point 6 in FIG. 1; and (b) by selection of the aperture shape of the dish, the wind loading on the dish above a horizontal line passing through the point 6 in FIG. 1 is substantially the same as the wind loading on the dish below the horizontal line through the point 6.

Such a design of this combination (i) clearly has the centre of mass a short distance, compared to the linear dimensions of the dish, above the lower edge of the dish, and (ii) should be realisable without the need to resort to the use of a counterweight. However, the present invention does not preclude the use of a counterweight. Indeed, since attempts will be made to modify existing large dish antennas (including solar collectors) to achieve the benefits of the present invention, it is likely that at least one counterweight will be required to ensure that the centre of mass of the "combination" lies on, or is close to, a horizontal line through the point 6. (In general, use of a counterweight should be avoided if possible, in view of the disadvantages, noted above, when counterweights are added to the dish support frame, and the fact that the addition of a counterweight will not affect the distribution of the wind loading on the dish.)

Figure 2:
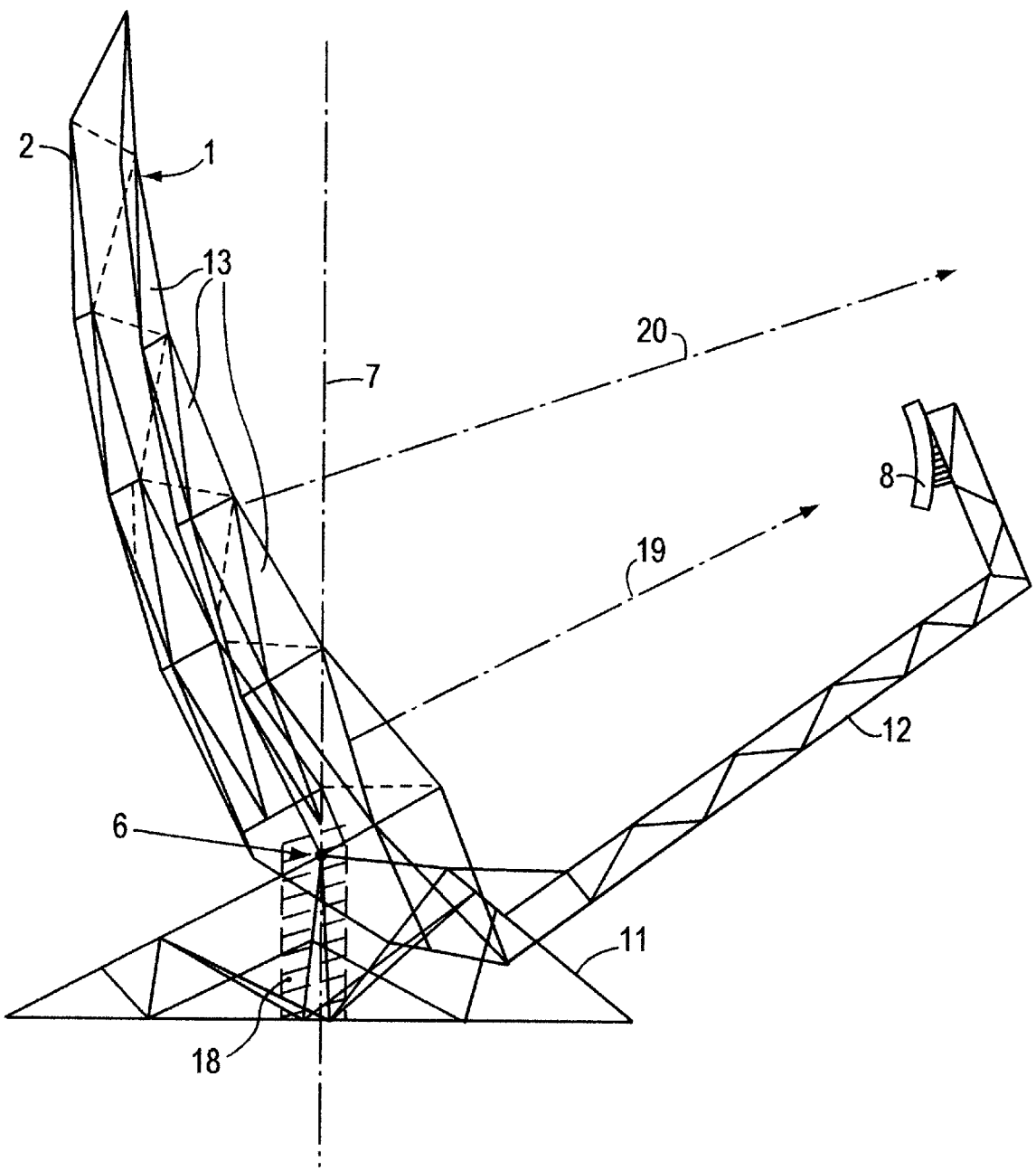
FIG. 2 is a partly schematic side elevation of a solar energy collector, also constructed in accordance with the present invention, which concentrates the solar energy reflected from its dish onto a secondary reflector.
Figure 3:
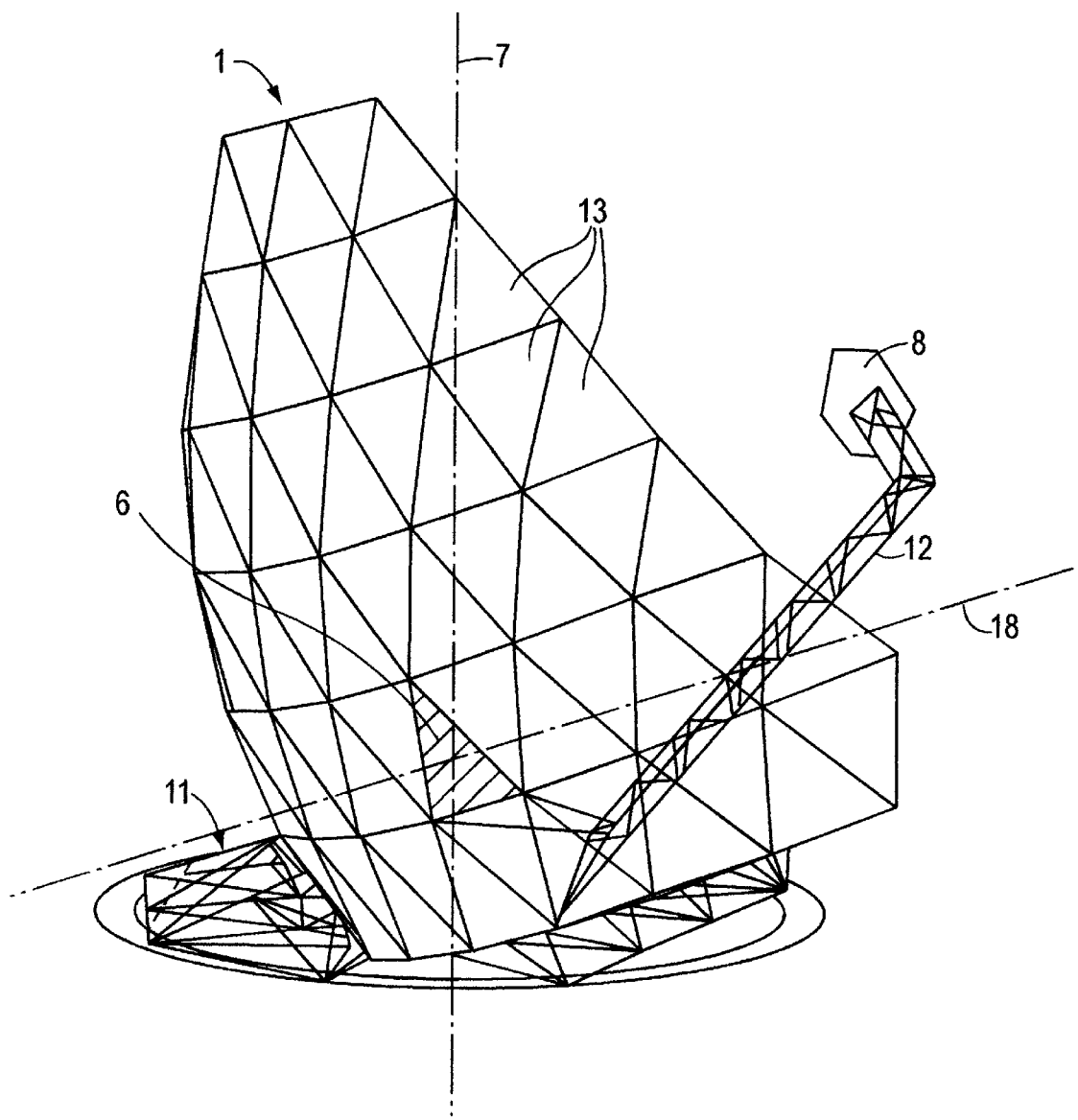
FIG. 3 is a perspective sketch of the solar energy collector which is illustrated in FIG. 2.

FIGS. 2 and 3 depict another solar collector with altitude-azimuth tracking, which is constructed in accordance with the present invention. The collector shown in FIGS. 2 and 3 has a number of features which are similar to those of the collector of FIG. 1, namely the dish 1 constructed using a number of triangular reflective elements 13, the dish support frame 2 (preferably constructed using rigid struts 3 in the form of a plurality of tetrahedral strut assemblies), the base frame 11, the vertical axis of rotation 7, and the horizontal axis of rotation, 18, through the point 6. However instead of having a solar receiver at the zone into which the dish 1 reflects incident solar energy, the collector illustrated in FIGS. 2 and 3 has a secondary reflector 8 positioned at this zone. If the secondary reflector 8 is "on-axis", the dish 1 will have the pointing axis 19. If, however, the secondary reflector is "off-axis", the dish would typically have the pointing axis 20. (The two alternative pointing axes, 19 and 20, can be shown in FIG. 2 because this Figure is a schematic drawing of the solar collector.)

The secondary reflector 8 is mounted on an ancillary support structure 12 which is also preferably constructed using a plurality of tetrahedral strut assemblies. The ancillary support structure 12 is rigidly connected to the lower region of the dish support frame 2. The centre of mass of the "combination" of the dish, its support frame, the secondary reflector 8 and its ancillary support structure 12 is also designed to be at or close to the horizontal axis of rotation 18 of the dish 1.

In each of the solar collectors illustrated in FIGS. 1 to 3, the vertical axis of rotation 7 intersects (or nearly intersects) the transverse (horizontal) axis of rotation 18. This is particularly advantageous in the case of the collector shown in FIGS. 2 and 3 if the secondary reflector 8 is positioned and shaped to concentrate the solar energy that it reflects into a focal zone which is at, or is substantially at, the point of intersection (or near intersection) of the axes 18 and 7. If a solar energy receiver is mounted at this intersection point, and an aperture is provided in the dish 1 (by omitting one or more of the reflecting elements 13) so that solar energy which has been re-reflected by the secondary reflector 8 is not intercepted by the dish 1, the solar energy that is concentrated by the dish 1 and the secondary reflector 8 will always be incident on the solar energy receiver. Thus a fixed solar energy receiver mounted at the axis intersection point will always receive the "collected" solar energy.

A fixed solar energy receiver is particularly advantageous. Flow control of any absorbing fluid supplied to the receiver (for example, using the helical pipe 18 shown in FIG. 2) and insulation of the fluid conveying conduits is much easier than when the solar energy receiver moves when the collector dish moves. In addition, access to the receiver during use of the dish is not a problem.

Preferably, the secondary reflector 8 is mounted on the support structure 12 so that it can be pivoted to direct the solar energy that it receives to a range of concentration zones. This feature, with an appropriate drive mechanism for the secondary reflector, provides a safety arrangement in the case of the collector of FIGS. 2 and 3, since the concentrated solar energy can be directed away from the fixed receiver should it be necessary to service the receiver, or in the event of overheating at the receiver. It will usually be simpler to vary the setting of the secondary reflector than to interrupt the tracking of the dish.

Control of the setting of the secondary reflector 8 is also a feature that will enable an array of two or more solar collectors, each of construction similar to that of the collector of FIGS. 2 and 3, to direct their incident solar energy to a single, fixed solar energy receiver, which is separate from the array of solar collectors.

Figure 4A:
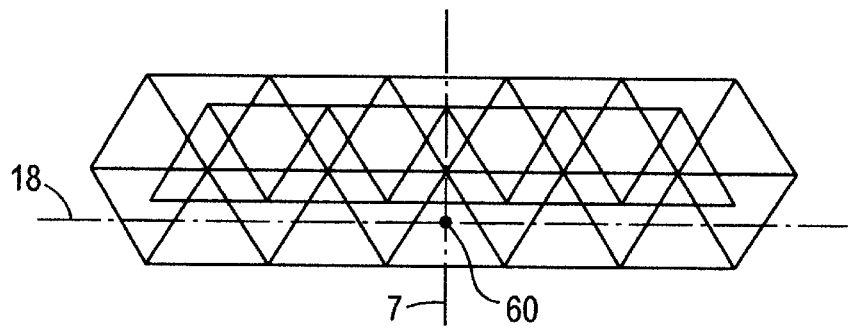
FIGS. 4(a), 4(b) and 4(c) show aperture shapes of the dish which the present inventor has used in the development of the present invention.
Figure 4B:
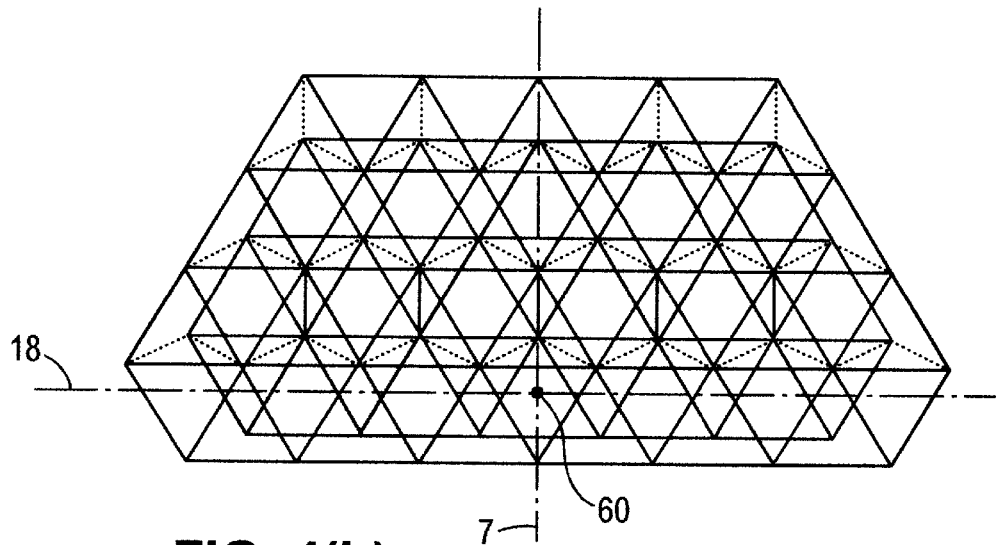
Figure 4C:
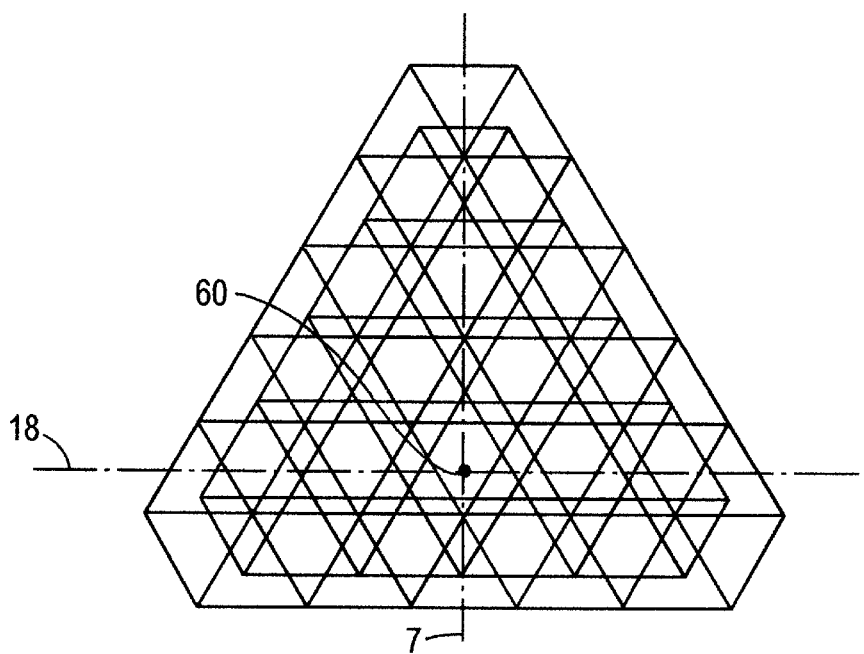

The collectors illustrated in FIGS. 1, 2 and 3 have dishes with an essentially triangular aperture. FIGS. 4(*a*), 4(*b*) and 4(*c*) illustrate three other aperture shapes for the dish 1 which will ensure that the requirement of the present invention (that the centre of mass of the "combination" defied above is a short distance, compared to the linear dimensions of the dish, above the lower edge of the dish) can be readily met, preferably without the use of counterweights. The low centre of mass, and hence the low transverse (horizontal) axis of rotation of the dish, achieved with these aperture shapes also ensures that the collector system will have a low profile when the dish is in the "parked" or "survival" position with the dish pointing vertically upwards (this alleviates forces experienced in strong winds, and that in turn reduces the strength requirements and thus the cost of the supporting base frame of the collector). The centre of mass 60 of the "combination" and the horizontal axis of rotation of the dish, 18, are each shown in FIGS. 4(*a*), 4(*b*) and 4(*c*).

As noted previously in this specification, the aperture shapes of FIGS. 4(*a*), 4(*b*) and 4(*c*) have been used by the present invention in the development work that culminated in this invention. The aperture shapes of FIGS. 4(*a*) and 4(*b*) do not exhibit balanced wind loading about the transverse axis of rotation 18 (though the dish of FIG. 4(*a*) has a fairly low profile), which is a feature of the aperture shown in FIG. 4(*c*). Thus FIG. 4(*c*) illustrates one shape of dish aperture that ay be used in the present invention. It is emphasised that aperture shapes other than the shape shown in FIG. 4(*c*) may be used in embodiments of the present invention.

Figure 6:
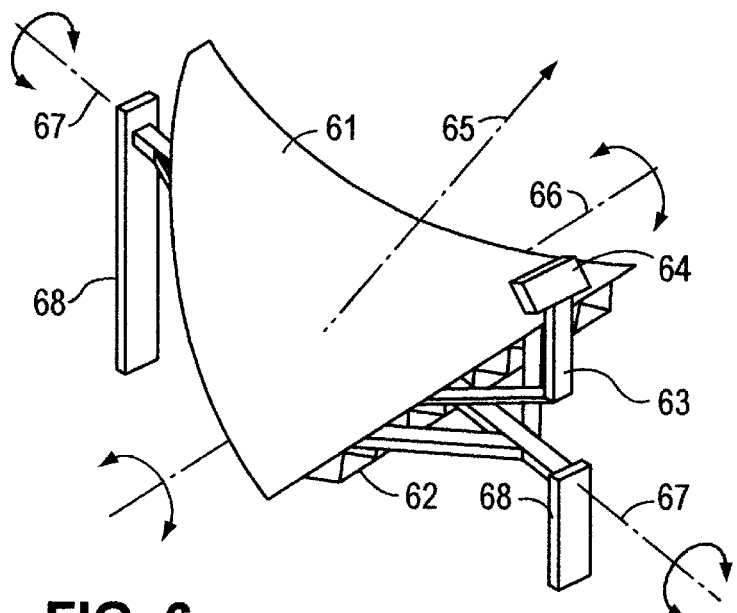
FIG. 6 is a schematic perspective sketch of a solar collector with a polar-equatorial arrangement for tracking the sun.

Polar equatorial tracking of a solar collector is sometimes preferred. FIG. 6 shows, schematically, a large aperture solar collector having a dish which is driven to point at the sun from sunrise to sunset, using the polar-equatorial tracking arrangement. The dish 61 is mounted on a support frame 62, which also carries an ancillary support 63 and a solar energy receiver 64. The combination of the dish 61, its support frame 62, the ancillary support 63 and the receiver 64 are mounted between supporting towers 68. The supporting towers are on the meridian through the collector, and thus ensure that the dish 61 is rotated about a north-south (polar) axis 67. The towers 68 and the structures extending therefrom on which the support frame 62 is mounted constitute the base structure of the solar energy collector.

Each day, after sunset or before sunrise, the pointing as 65 of the dish 61 is changed by rotating the dish slightly about a transverse axis 66, to ensure that the dish continues to point at the sun when it is once again rotated about the north-south axis 67. As shown in FIG. 6, at mid-day, when the sun is directly over the meridian through the dish, the transverse axis 66 is horizontal and is aligned east-west. The axis 66 is always orthogonal to the north-south axis 67. The angle trough which the dish 61 has to be rotated about the transverse axis 66 during the course of the year will depend upon the day of the year.

It will be appreciated that, whether a large aperture dish follows the sun using the altitude-azimuth or the polar-equatorial method of tracking, the transverse axis of rotation of the dish of the solar collector will be relatively close to the lower edge of the dish when the dish is in use. This feature reduces the forces experienced by the dish in strong winds when the dish is "parked" and facing vertically upwards (by rotation about the horizontal axis in the case of a dish with altitude-azimuth tracking; by retracting—that is, changing the height of—one or both of the supporting columns on which the dish support frame is mounted to establish the required polar axis in the case of a dish with polar-equatorial tracking). It is also preferable to construct the solar collector so that the transverse axis of rotation of the dish is as low as practicable, to further reduce the forces experienced in strong winds. (In fact, it is disadvantageous to mount the solar collector on the top of a tower or building.) In the case of a dish that tracks the sun using a polar-equatorial tracking arrangement, it will be advantageous to provide a pit or hollow under the dish, to enable the dish (i) to track the sun in the early morning and in the late afternoon, and (ii) to be "parked" by retracting the supporting columns and lowering the dish into the hollow or pit, thus reducing the exposure of the collector structure to wind.

Figure 5:
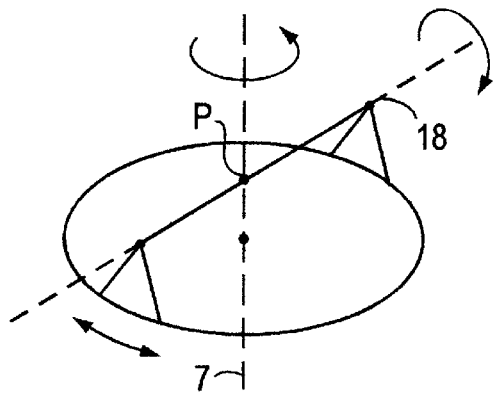
FIG. 5 is a simple diagram which illustrates a feature of the present invention when the dish has an altitude-azimuth arrangement for tracking the sun.

FIG. 5 shows, in simple, schematic form, how the dish of FIG. 1, and the dish illustrated by FIGS. 2 and 3, when tracked using altitude-azimuth actuation with intersecting horizontal and vertical axes of rotation, will always rotate about a fixed point P.

Figure 7:
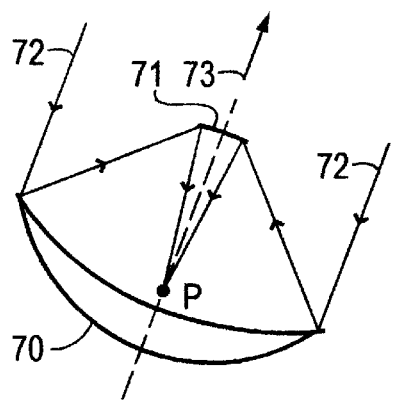
FIG. 7 is a plan view of a Cassegrain optics arrangement for concentrating solar energy.

FIG. 7 shows how a dish 70 will reflect solar radiation 72 into a concentrated zone at which a secondary reflector 71 is positioned, and that the re-reflection of this concentrated solar energy can be focused by the secondary reflector 71 to a single point P which (a) is on the pointing axis 73 of the dish, and (b) is at the centre of movement of the dish.

Figure 8A:
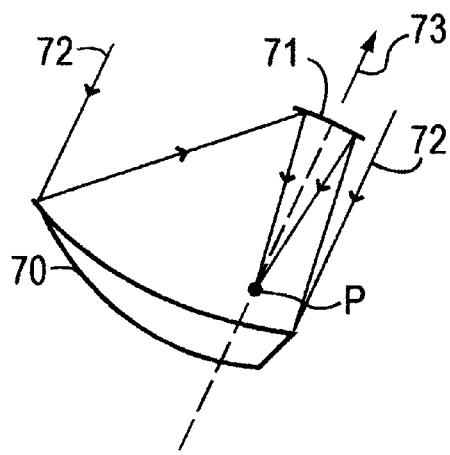
FIG. 8 shows schematic side and front views of a collector dish and secondary reflector, with the dish aperture being triangular and the dish arranged to concentrate the reflected solar energy into a zone which is on the pointing axis of the dish.
Figure 8B:
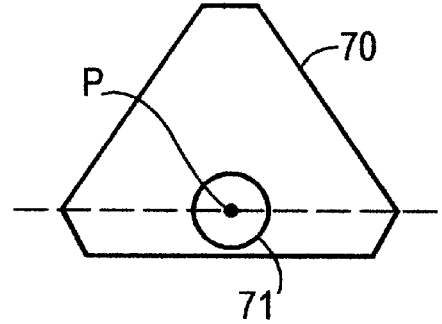
Figure 9A:
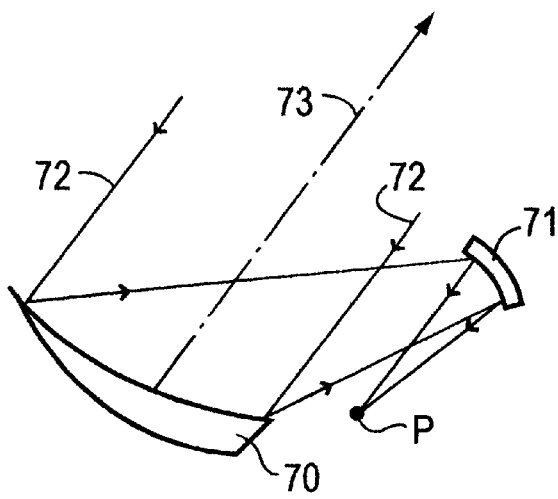
FIG. 9 consists of similar schematic views to those of FIG. 8, but with the concentration zone away from the pointing axis of the dish.
Figure 9B:
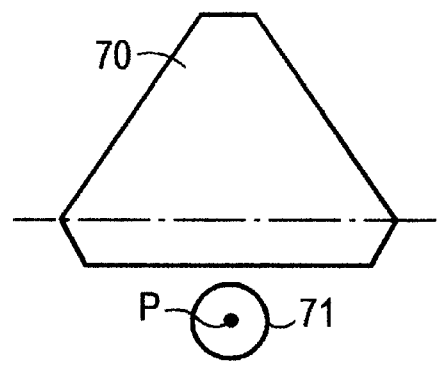

FIG. 8 shows the arrangement illustrated in FIG. 7 when the aperture of the dish 70 is essentially triangular in shape—as in FIGS. 2 and 3—and the dish concentrates the solar energy into a zone which is on the pointing axis 73 of the dish. FIG. 9 shows a similar collector construction to that illustrated in FIG. 8, but with the dish 70 constructed so tat it concentrates the reflected solar energy into a concentration zone that is off the pointing axis 73 of the dish.

It will be appreciated that the present invention will produce a solar collector which is effective in concentrating solar energy, and which can be constructed more economically than a conventional solar collector having a dish of comparable aperture size, because the collector is low-slung, balanced in terms of mass and wind loading, and inherently experiences less wind stress when the dish is "parked". There are also benefits in access to the dish for servicing and (when the Cassegrain arrangement with a secondary reflector is used) the ability to use a fixed solar receiver at the region where the transverse axis of rotation of the dish intersects (or nearly intersects) the orthogonal axis of rotation of the dish.

It will also be appreciated that although specific embodiments of the present invention have been illustrated in the accompanying drawings and described above, those embodiments are illustrative only. Variations to and modifications of those embodiments can be made without departing from the present inventive concept.

For example, if a solar collector is to be used to generate temperatures in the range of from 200° C. to 500° C., or to concentrate solar energy onto the solar cells in an array of solar cells, the reflective panels on the dish can be mounted to reflect the incident solar radiation to two or more zones of concentration, and a respective solar energy receiver (a solar cell is one form of solar energy receiver) or secondary reflector can be positioned at each of those zones. If solar energy receivers adapted to heat a fluid are mounted (on an ancillary support) at those concentration zones, each receiver may be supplied with a fluid that absorbs the solar radiation, in accordance with conventional practice. If secondary reflectors are mounted (on an appropriate ancillary support) at the concentration zones, each secondary reflector will reflect the solar energy that it receives from the dish to a respective remote solar energy receiver. One of the remote solar energy receivers may be located at the point of intersection (or approximate intersection) of the two axes of rotation of the dish. However, secondary reflector actuation means will normally be provided to vary the angle that each secondary reflector presents to the dish, so that each secondary reflector will direct the solar energy that it receives to its associated solar energy receiver.

I claim:

1. A solar energy collection antenna comprising a reflecting dish having a large aperture, said dish being mounted on a dish support frame, said dish support frame being mounted for rotation about a first a which is transverse the dish and a second axis which is orthogonal to said first axis; either a secondary reflector or a solar energy receiver mounted on ancillary support means affixed to said dish or to said dish support fame, said secondary reflector or receiver being located at a zone into which, when said dish is in use and is receiving solar energy, the solar energy reflected from said dish is concentrated; the combination of said dish, said dish support frame, said ancillary support means and said secondary reflector or said receiver having a combination centre of mass; characterised in that:

(a) the distance of said combination centre of mass above the lower edge of said dish is small relative to the linear dimensions of said dish;

(b) said first axis substantially intersects said second axis;

(c) said combination centre of mass lies substantially on said first axis, and (d) the shape of said aperture is such that, when the solar collector is in use, the wind loading on said dish below said first axis is substantially equal to the wind loading on said dish above said first axis.

2. A solar energy collector as defined in claim 1, in which said dish, when in use and receiving solar energy, reflects solar energy to at least two separate concentration zones, and an associated solar energy receiver or secondary reflector is mounted on said ancillary support means and located at each of said concentration zones; and said combination comprises said dish, said dish support frame, said ancillary support means and each secondary reflector or solar energy receiver.

3. A solar energy collector as defined in claim 1, in which said first axis is horizontal and said second axis is vertical, said collector including first actuation means to rotate said dish about said horizontal axis and second actuation means to rotate said dish about said vertical axis, to provide altitude-azimuth tracking of the sun by said dish.

4. A solar energy collector as defined in claim 3, in which said dish support frame is mounted on a base frame and said second actuation means comprises means to rotate said base frame.

5. A solar energy collector as defined in claim 1, in which said second axis is a north-south axis, said collector including first actuation means to rotate said dish about said transverse axis and thereby change the angle between the pointing axis of said dish and said north-south axis, and second actuation means to rotate said dish about said north-south axis, to provide polar-equatorial tracking of the sun by said dish.

6. A solar energy collector as defined in claim 1, in which a solar energy receiver is provided at said zone of concentration and either (i) said solar energy receiver comprises at least one solar cell, or (ii) fluid material is supplied to said solar energy receiver.

7. A solar energy collector as defined in claim 2, in which a respective solar energy receiver is provided at each zone of concentration and either (i) each solar energy receiver comprises at least one solar cell, or (ii) fluid material is supplied to each solar energy receiver.

8. A solar energy collector as defined in claim 1, in which a secondary reflector is provided at said zone of concentration, to reflect incident energy to a distant solar energy receiver.

9. A solar energy collector as defined in claim 8, in which said distant solar energy receiver is positioned at the intersection point, or the substantial intersection point, of said first and second axes.

10. A solar energy collector as defined in claim 8, in which said distant solar energy receiver is remote from said collector, including secondary reflector actuation means adapted to vary the angle that said secondary reflector presents to said dish, whereby solar energy received from said dish by said secondary reflector is reflected to said distant solar energy receiver.

11. A solar collector as defined in claim 2, in which a respective secondary reflector is provided at each zone of concentration, each secondary reflector reflecting incident solar energy to a respective distant solar energy receiver.

12. A solar collector as defined in claim 11, in which one of said distant solar energy receivers is positioned at the intersection point, or the substantial intersection point, of said first and second axes.

13. A solar collector as defined in claim 11, including secondary reflector actuation means to vary the angle that each secondary reflector presents to said dish, whereby solar energy received from said dish by said secondary reflectors is reflected to said distant solar energy receivers.

14. A solar collector as defined in claim 1, in which said dish support frame is constructed using a plurality of strut assemblies, each strut assembly comprising six rigid struts assembled in a tetrahedral formation.

15. A solar collector as defined in claim 4, in which said first axis is close to the surface on which said base frame of the collector is mounted.

16. A solar collector as defined in claim 5, including a base structure on which said dish support frame is mounted, said first axis being close to the surface on which said base structure is mounted.

17. A solar collector as defined in claim 1, in which said dish has a pointing axis and said receiver or secondary reflector is positioned away from said pointing axis.

* * * * *

UNITED STATES PATENT AND TRADEMARK OFFICE
CERTIFICATE OF CORRECTION

PATENT NO. : 5,934,271
DATED : August 10, 1999
INVENTOR(S) : Stephen Kaneff

It is certified that error appears in the above-identified patent and that said Letters Patent is hereby corrected as shown below:

Column 1 , line 18: change "utilises " to --utilizes--

Column 2, line 50: change "their" to --its--

Column 3, lines 39 and 45 :change "centre" to --center--

Column 3, lines 41/42: change "linear dimensions" to --top to bottom dimension--

Column 4, lines 11, 12, 16 and 34:change "centre" to --center--

Column 4, line 11: change "characterised" to --characterized--

Column 4, lines 13/14: change all after "is" to --smaller than the distance between the dish's center of mass and the uppermost point of the dish;--

Column 4, line 31: change "minimise" to --minimize--

Column 4, line 37: change "minimises" to --minimizes--

Column 5, line 63: change "centre" to --center--

UNITED STATES PATENT AND TRADEMARK OFFICE
CERTIFICATE OF CORRECTION

PATENT NO. : 5,934,271
DATED : August 10, 1999
INVENTOR(S) : Stephen Kaneff

It is certified that error appears in the above-identified patent and that said Letters Patent is hereby corrected as shown below:

Column 6, lines 3, 12 and 43: change "centre" to --center--

Column 6, line 4 after "dimensions" insert --(that is, the top to bottom dimension )--

Column 6, line 6: change "realisable" to -realizable--

Column 7, lines 26, 30 and 37: change "centre" to --center--

Column 7, line 27: after "dimensions" insert --(that is, the top to bottom dimension )--

Column 8, line 44: change "centre" to --center--

Column 9, lines 41,43 and 47: change "centre" to --center--

Column 9, line 42 change "characterised" to --characterized--

UNITED STATES PATENT AND TRADEMARK OFFICE
CERTIFICATE OF CORRECTION

Page 3 of 3

PATENT NO. : 5,934,271
DATED : August 10, 1999
INVENTOR(S) : Stephen Kaneff

It is certified that error appears in the above-identified patent and that said Letters Patent is hereby corrected as shown below:

```
Column 9, lines 44/45: delete "small relative to the linear dimension"
and substitute --smaller than the distance between the
center of mass and the uppermost point--
```

Signed and Sealed this

Seventeenth Day of April, 2001

Attest:

NICHOLAS P. GODICI

Attesting Officer

Acting Director of the United States Patent and Trademark Office